(12) United States Patent
Blades

(10) Patent No.: US 6,927,579 B2
(45) Date of Patent: Aug. 9, 2005

(54) PARALLEL ARC FAULT DIAGNOSTIC FOR AIRCRAFT WIRING

(75) Inventor: Frederick K. Blades, Boulder, CO (US)

(73) Assignee: Astronics Advanced Electronic Systems, Corp., Redmond, WA (US)

( * ) Notice: Subject to any disclaimer, the term of this patent is extended or adjusted under 35 U.S.C. 154(b) by 6 days.

(21) Appl. No.: 10/439,709

(22) Filed: May 16, 2003

(65) Prior Publication Data

US 2003/0201780 A1 Oct. 30, 2003

Related U.S. Application Data

(62) Division of application No. 10/055,753, filed on Jan. 23, 2002, now Pat. No. 6,777,953.
(60) Provisional application No. 60/296,734, filed on Jun. 11, 2001, provisional application No. 60/278,679, filed on Mar. 27, 2001, and provisional application No. 60/263,508, filed on Jan. 24, 2001.

(51) Int. Cl.[7] .............................. G01R 31/08; H01H 9/50
(52) U.S. Cl. ...................... 324/536; 324/535; 324/540
(58) Field of Search .............................. 324/536, 534, 324/535, 539, 540, 541

(56) References Cited

U.S. PATENT DOCUMENTS

| | | | | |
|---|---|---|---|---|
| 4,316,139 A | * | 2/1982 | Root ........................... | 324/535 |
| 4,384,249 A | * | 5/1983 | Medina ....................... | 324/540 |
| 4,835,479 A | * | 5/1989 | Haines ........................ | 324/540 |
| 5,083,086 A | * | 1/1992 | Steiner ........................ | 324/533 |
| 5,726,574 A | * | 3/1998 | Silverberg et al. ........... | 324/536 |
| 6,300,767 B1 | * | 10/2001 | Kliman et al. ............... | 324/536 |

* cited by examiner

Primary Examiner—Vincent Q. Nguyen
Assistant Examiner—Timothy J. Dole

(74) Attorney, Agent, or Firm—Wiggin and Dana, LLP; Gregory S. Rosenblatt; Elizabeth A. Galletta

(57) ABSTRACT

A system for locating parallel arcing faults in a set of wires is described. The system includes three devices that can be used in combination or alone. A first device applies a current to a wire while grounding the remaining wires of the set of wires so as to cause the parallel arc, the first device being adapted to locate the parallel arcing fault using one or more leading edges of one or more electromagnetic waveforms being conducted on the wire under test. A second device comprises a controller and two or more receivers, each receiver being electrically coupled to the controller for receiving one or more leading edges of one or more electromagnetic waveforms being radiated by the parallel arcing fault. A third device senses one or more leading edges of one or more electromagnetic waveforms as well as the ultrasonic emissions emitted from the parallel arcing fault.

10 Claims, 11 Drawing Sheets

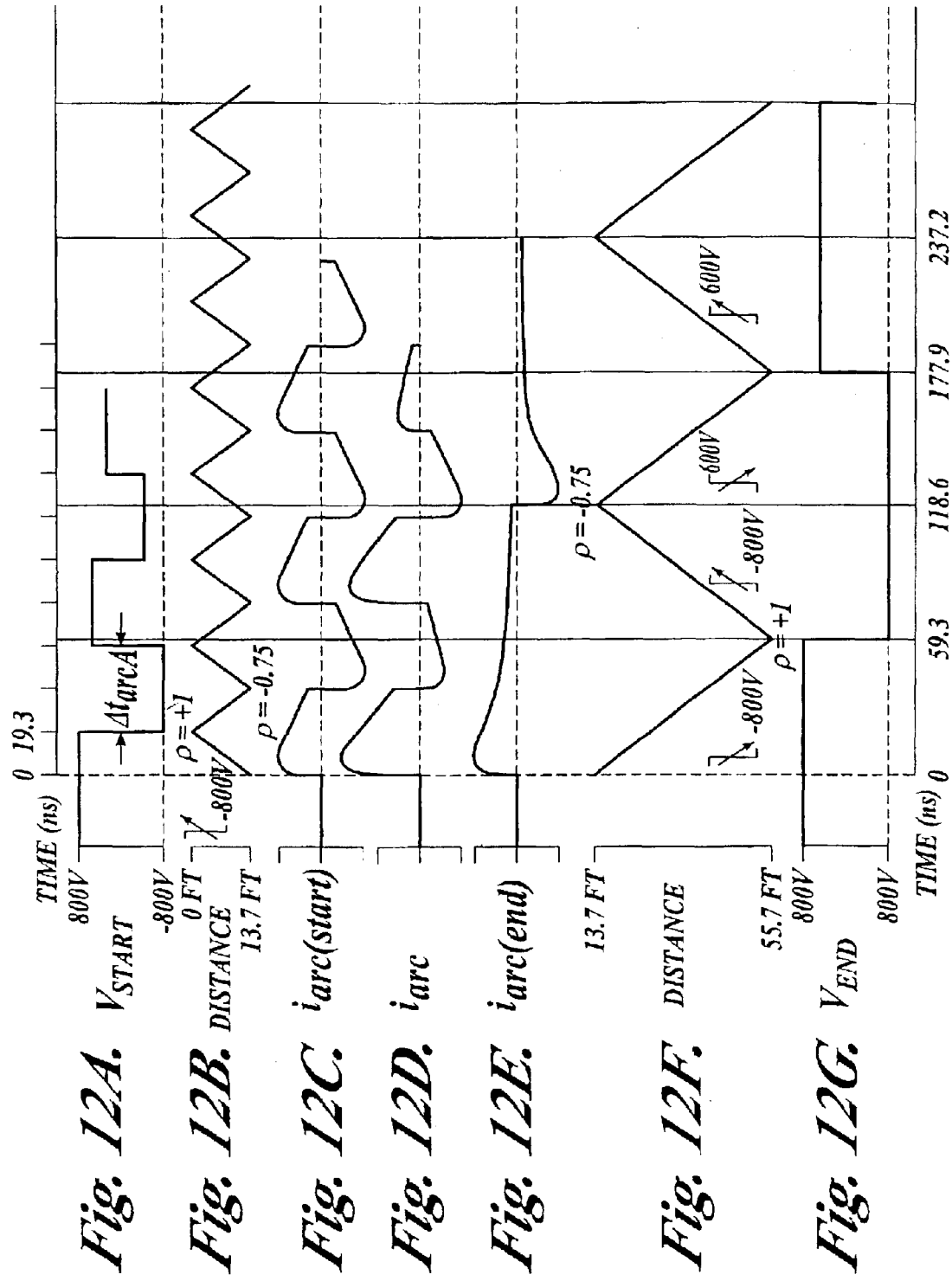

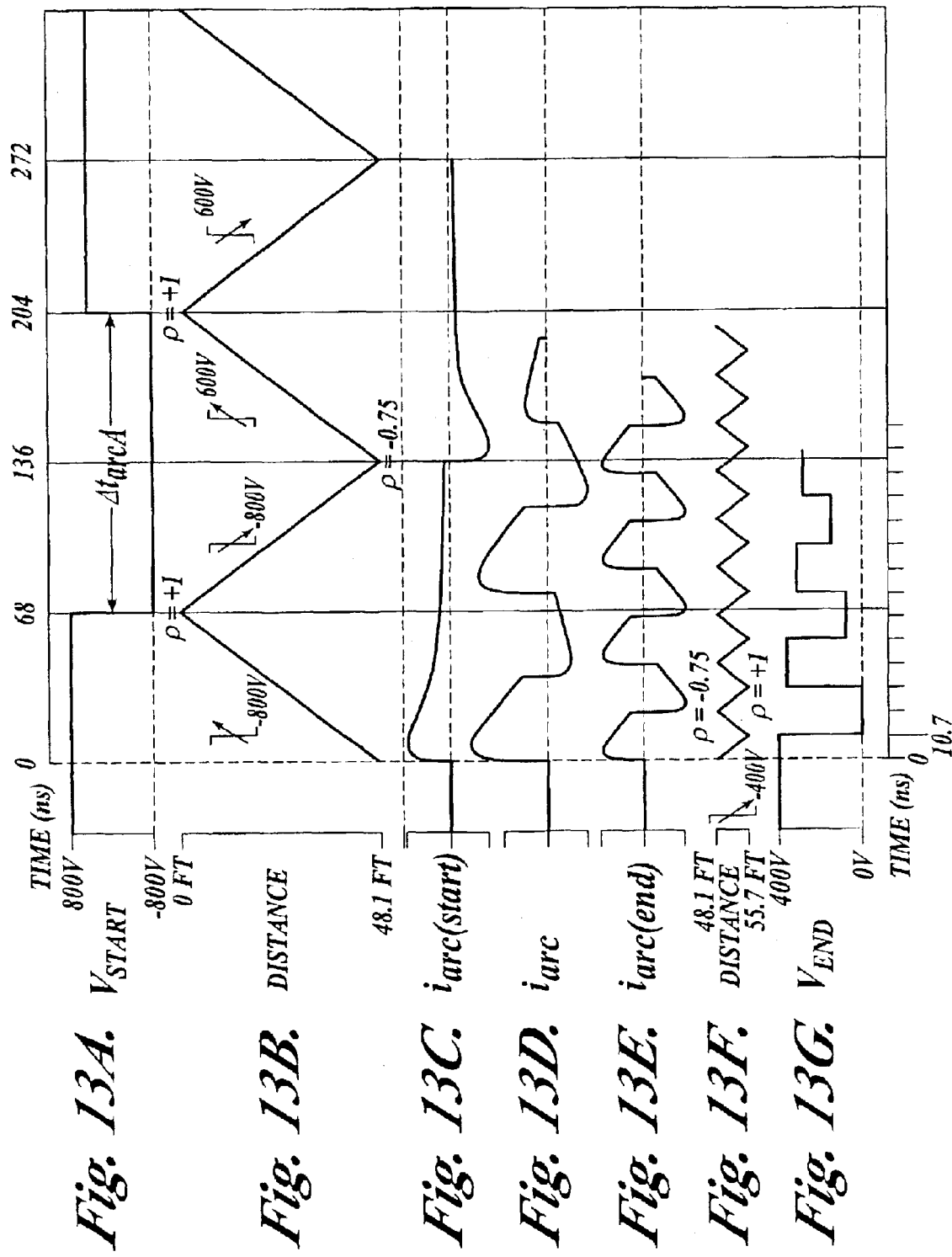

$t_{34}$

PARALLEL ARC FAULT DIAGNOSTIC FOR AIRCRAFT WIRING

CROSS-REFERENCES TO RELATED APPLICATIONS

This application is a division of U.S. application Ser. No. 10/055,753, filed Jan. 23, 2002, now U.S. Pat. No. 6,777,953 which claims the benefit of U.S. Provisional Application Nos. 60/263,508, filed Jan. 24, 2001; 60/278,679 filed Mar. 27, 2001; and 60/296,734 filed Jun. 11, 2001, which are expressly incorporated herein by reference.

FIELD OF THE INVENTION

The present invention generally relates to the detection of insulation faults in electrical wiring that may lead to electrical arcing. More specifically, it relates to a system of diagnostic tools by which insulation faults in wiring systems can be revealed and located before they develop into arcing faults. Although principally directed towards the diagnosis of wiring faults in aircraft wiring systems, these methods and tools apply directly to other fields including residential, industrial and commercial power systems. In this patent the word "fault" is used to refer to both a degradation of the insulation, e.g., an "insulation fault" and a specific failure, e.g., an "arcing fault."

BACKGROUND OF THE INVENTION

A parallel arcing fault occurs when an undesired electrical arc bridges the gap between two conductors or a conductor and ground. Since the dielectric strength of air is known to be approximately 31 kV/cm, it is generally understood that exposed conductors in air and at line voltages (e.g., 117V rms) must come to within a few mils (1 mil=0.001 in) of each other before an arc can strike (Note that 167 Volts peak divided by 31 kV/cm is 2.1 mils). Power distribution systems are therefore commonly designed to avoid this by maintaining conductor separation much greater than a few mils and/or providing adequate insulation between the conductors. It is also understood that parallel faults may develop if the separation between said conductors is inadvertently diminished or if the integrity of the insulation is violated as the result of, for example, chaffing caused by mechanical vibration. In addition to these obvious scenarios there are subtler, less obvious ways in which parallel faults might develop, particularly in the aircraft environment.

First there must be exposed conductors. These can be found at the terminals of circuit breakers, on terminal strips and at some connector terminals. Conductors inside wires may become exposed as a result of aging cracks or holes in the insulation. In October of 2000, an FAA aviation industry task force reported that during the inspection of a relatively small amount of Kapton wiring on both a >20 year old Airbus A300 and a Lockheed L-1011, 9 cracks that exposed the conductor were found on the former and 13 cracks on the latter. See Christopher Smith, *Transport Aircraft Intrusive Inspection Report*, The Intrusive Inspection Working Group (Dec. 29, 2000). From this limited data they extrapolated that there might be up to 900 cracks on the A300 and 3,000 on the L-1011. It should be recognized that even a large number of aging cracks in the wire insulation pose little danger of arcing unless the separation between two cracks or a crack and the airframe becomes small enough for an arc to occur at normal operating voltages. How small? Based on a simple linear extrapolation of the dielectric breakdown voltage of air the separation would have to be on the order of several mils or less for arcing to occur. Unfortunately, parallel faults can develop across separations substantially greater than this due to secondary environmental influences.

Once there are exposed conductors within a fraction of an inch of each other or the airframe, initial conduction across the gap can develop in several ways. First, if a voltage surge high enough to span the gap occurs, resulting from an inductive switching transient or perhaps induced by a lightning strike, the localized heating from the momentary arc can carbonize insulating material under the arc, including dust or other contamination on the surface of the wire, and form a high-impedance conduction path. A second and perhaps more likely scenario involves water that normally condenses on the inner shell of the aircraft as the outside temperature drops precipitously during flight. This condensation water readily dissolves impurities that are present and becomes a mildly conductive electrolyte that can conduct a small AC current across the gap. This current produces heat and the heat evaporates the water leaving behind molecular islands of salt that eventually form a kind of archipelago of larger conductive islands. Each time it gets wet, the electrolyte itself will support current flow and add more salts to the developing archipelago. The arc breakdown potential is proportional to the sum of the distances between conductive islands.

What happens next depends on the wire insulation material. Both a Polyimide plastic, sold under the brand name "Kapton", and Fluorocarbon plastic, sold under the brand name "Teflon", have been widely used in aircraft wiring. If the insulation is Teflon, this low-current arc will repeatedly extinguish with little damage done. If the insulation is standard Kapton (i.e., non fire-resistant), the low-current salt bridge arc will likely soon involve the Kapton itself, expand and escalate rapidly into a near explosion of current that often destroys not only the wires involved, but also adjacent ones in the wire bundle.

A number of articles in the press have noted the apparent arcing danger of Kapton insulation. In the presence of a low-current arc Kapton insulation can easily develop into an explosive arc while Teflon exhibits only gradual, slow deterioration of the Teflon heated by the arc. Research by the present inventor has shown that Kapton can become conductive in the near vicinity of an arc. Localized heating of the Kapton apparently oxidizes portions of it to a conductive intermediary (remaining amber in color, it does not appear to be completely oxidized to carbon at this stage) that reduces the arc gap and increases the electric field strength. Under a stereo microscope, one can see minute pieces of Kapton conducting current and arcs jumping from the glowing Kapton to the metal conductor. Insulating materials like Teflon contain halogens that inhibit oxidation by producing by-products that are more electronegative than Oxygen, e.g., Fluorine. Standard Kapton doesn't have this fire inhibitor and this may, in part, explain the difference.

The formation of aging or stress-induced cracks in the insulation and the repetitive condensation, wetting, and low-current arc induced evaporation cycle together form a progressive degeneration process that can lead to parallel arcing. Mechanical chafing of the wire insulation can also lead to parallel arcing. As the world's fleet of commercial and private aircraft age, particularly now that many aircraft over 20 years old are still flying, the likelihood of such faults occurring increases. If these developing faults can be detected early enough, the insulation could be repaired or replaced before the fault develops into a dangerous arcing fault. A need exists, therefore, for a means by which wiring harnesses could be tested to reveal these conditions as they are developing.

The present inventor realized that developing parallel faults, due to mechanical chafing or aging cracks in the insulation, for example, will generally exhibit a progressively declining breakdown voltage until a point is reached where the arcing becomes self-sustaining and dangerous. Such developing faults in the insulation are initially non-conductive and usually so small as to make no perceptible change in the characteristic impedance of the cables. The only practical way to reveal reduced conductor spacing (or a non-conducting salt bridge) is to apply a higher-than-normal voltage to the junction, a testing procedure commonly referred to as HiPot (High Potential) testing. A traditional DC HiPot tester, however, which allows 10 ma of current to flow after breakdown, can itself heat the insulator enough to form a carbon track and damage the insulation. A conventional HiPot tester can also damage equipment left connected to the harness during testing. A further need exists, therefore, for a means by which the breakdown voltage can be measured without damaging the wire insulation or any electronic devices inadvertently connected to the harness.

Wire harnesses in modern aircraft are dense, multi-legged, and routed throughout the plane—up to 140 miles of wire in a typical wide-body jet. Hundreds of connectors are placed along the harnesses to allow modular assembly and disassembly of components. Because access to wiring harnesses is very limited on an operational aircraft, such testing is probably best done during periodic heavy-checks, whereupon panels and floorboards are removed to facilitate access. Even in this case, however, specific wire bundles may be very long and difficult to access. There exists a further need, therefore, to provide practical means to physically locate the developing parallel fault once it has been revealed.

SUMMARY OF THE INVENTION

One principal idea of the present invention is based on the understanding that as a parallel fault develops over time, due to chaffing, etc., the dielectric withstanding voltage of the fault will fall in approximate unison. If a voltage higher than the normal operating voltage is applied to such an imminent fault, it can be made to flash over before it would in normal operation thus revealing the fault before it becomes an actual arcing fault.

The dielectric voltage test is performed according to the present invention by charging the interwire capacitance between a first Wire Under Test, or WUT, and the remaining grounded wires of the floating cable harness, using a microampere, high-compliance current source. In this manner, the voltage on the WUT rises from zero in a ramp-like fashion to a specified maximum test voltage. If a fault exists between the WUT and any other wire or ground (the airframe) that has a breakdown voltage less than the maximum test voltage, a single low-energy discharge will occur at the fault, discharging the cable capacitance into the arc. Since the interwire cable capacitance will be on the order of hundreds of picofarads only, the total energy in the discharge will be low, on the order of microjoules. This is on the order of the energy contained in a static spark discharge when walking across a carpet and then touching a grounded surface and is low enough to avoid damaging the wire insulation at the fault. Also, by charging the cable with a microamp-range current source no danger is presented to any devices that may inadvertently be left connected to the harness during the test. If, for example, connectors at the far end of the harness are inadvertently left plugged into their loads, a 1 microamp current source will only be able to charge the line to a few millivolts. In this case, the test system will sense this condition and indicate to the user to disconnect the loads before proceeding.

With a 1 microamp current source, a cable interwire capacitance of 1000 pf, and a maximum test voltage of 1500 volts, for example, the complete ramp sequence for the first WUT will take less than 2 seconds. Assuming no breakdown, an automatic sequencer then switches to the next wire in the harness, makes this the second WUT, grounds the others, and repeats the sequence. In this manner, the entire harness can be quickly and automatically tested for parallel faults between conductors or between any conductor and ground.

If a fault exists with a breakdown voltage below the maximum test voltage, a single micro-energy discharge will occur across the fault. A second principal idea of the present invention is based on the realization that the leading edge of this discharge will be extremely clean and fast, dropping from the high breakdown voltage to zero in a fraction of a nanosecond. Because electromagnetic radiation travels at about 1 ft/ns any method for locating the arc based on the measurement of time delays would have to resolve time differences on the order of a nanosecond or better. To obtain repeatable and, therefore, useful results, the edge of the signal received signal must be very sharp, clean and repeatable to a nanosecond or better. The inherent speed and amplitude of the edge produced by the single spark discharge described above meets this criteria and therefore makes possible several different locating methods, to be discussed later.

The sharpness of the received leading edge depends on how quickly the stored charge can be delivered to the arc. If, for example, a discrete capacitor is connected to the arc gap with a wire, the charge stored in the capacitor must travel through this wire to be delivered to the arc. The inductance of this wire together with whatever capacitance exists at the arc forms a low-pass filter that slows down the leading edge. A controlled-impedance cable such as a coaxial cable, on the other hand, acts like a transmission line—the distributed inductance and capacitance work in unison, transferring the charge back and forth much in the same manner as the mechanism that allows the propagation of electromagnetic waves through space. Thus, the fast leading edge is preserved in a controlled impedance cable. Indeed, it is well known by those skilled in the art that the most convenient means of producing a fast leading edge in the laboratory is to discharge a coaxial cable charged to a high voltage.

A cable harness typical to aircraft wiring is not designed to be a controlled impedance transmission line. Research by the present inventor, however, has shown that because the wires are tightly and neatly bundled according to aircraft harnessing standards, and because all the wires in the bundle are grounded except the single WUT, the impedance becomes relatively constant and the combination acts like a transmission line. Depending on the number of wires and the thickness of the insulation, the resulting impedance is typically 50–80 ohms. Even when individual wires feed off the harness the effect on the impedance at that point is minimal because that wire is only one of many that serve as the ground return.

In accordance with the present invention, this fast edge from the micro-energy arc induced at the fault is used in two different ways to determine the location of the arc. In a first method, based on conducted energy, the difference in arrival times between the reception of the leading edge at one end of the cable harness and a second reflected edge at the same end of the harness, is used to calculate the approximate distance down the cable that the arc originates. In a second spatial method, based on radiated energy, two or more miniature high-speed electromagnetic radiation receivers are employed and the difference in arrival times is used to calculate where in the space between the receivers the arc originates. With one pair of receivers, the arc can be located in one dimension, with two pairs in two dimensions, and with three or more pairs in three dimensions. A third and final arc locating method uses a handheld ultrasonic monitor to measure and indicate the distance from the operator to the arc. It measures both the electromagnetic pulse from the arc and the ultrasonic emission from the arc and uses the difference in arrival times to calculate the distance to the arc.

Though the spatial arc locating method described above is presented as an adjunct to the MED tool, it can be also used separately to rapidly detect and locate in space any type of electrical arcing, including series or parallel arcing. Though perhaps less immune to extraneous noise than other arc detection methods, the spatial method offers the ability to both detect and locate an arc within a microsecond or less. Existing known methods for electrical arc detection are much slower and cannot locate the arc. Thus, the spatial method offers real advantages over existing arc monitoring methods in certain applications, particularly those where there is some control can be exerted over extraneous noise. One application possibility is the use of this spatial arc locating method inside an aircraft during a heavy check procedure as a non-intrusive method to detect and locate electrical arcs as individual systems are turned on and off.

The preferred embodiment of the present invention is a Parallel Fault Diagnostic System that comprises three separate components. The first component, referred to as the Micro-Energy Dielectric Tool or MED tool, is a handheld, battery-operated unit that plugs into a cable harness using an adapter cable, and applies a low-current, high-compliance current source sequentially to each conductor in the harness while grounding all other conductors. The interwire capacitance between each conductor and the others is thus charged in a ramp-like fashion to a specified maximum test voltage. An internal microprocessor system takes various measurements during this ramp process and, from these, calculates the insulation resistance and capacitance for display to the user. If a breakdown occurs between the charged wire and any other wire or ground, the microprocessor will record the voltage level at which the breakdown occurred and switch automatically to a fault-locating mode. High-speed circuits internal to the MED tool will now process the received high-frequency edges and attempt to determine how far down the cable the fault is. If the fault is from wire to wire, the signal will usually give a clear reading of this distance. If the fault is from a wire to ground (the airframe) the signal may be discerned using other techniques described below to calculate the distance.

A second component, referred to here as the Electromagnetic Locating Tool or EML tool, is another battery-powered, handheld unit that provides a second independent method for locating the arc. The EML tool consists of a small, handheld controller and two or more small receiver units, each connected to the controller with a coaxial cable. The receivers are placed at the extremes of the area to be monitored and the controller is held in the technician's hand. This EML tool works by receiving the radiated electromagnetic edge produced by an arc simultaneously with multiple receivers, and then calculating the location of the arc relative to the controller based on the difference in signal arrival times.

A third component, the Ultrasonic Locating Tool or USL tool, is another handheld unit that provides yet a third method of locating the fault. The USL tool senses both the electromagnetic edge and the ultrasonic radiation from the discharge and, by timing the difference in arrival times, determines the distance from the user to the arc.

The MED tool may work in unison with the EML and USL options.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 12 is an explanatory chart for the signal of FIG. 10.

FIG. 13 is an explanatory chart for the signal of FIG. 11.

DETAILED DESCRIPTION OF THE PREFERRED EMBODIMENT BREAKDOWN VOLTAGE OF AIR

Figure 1:
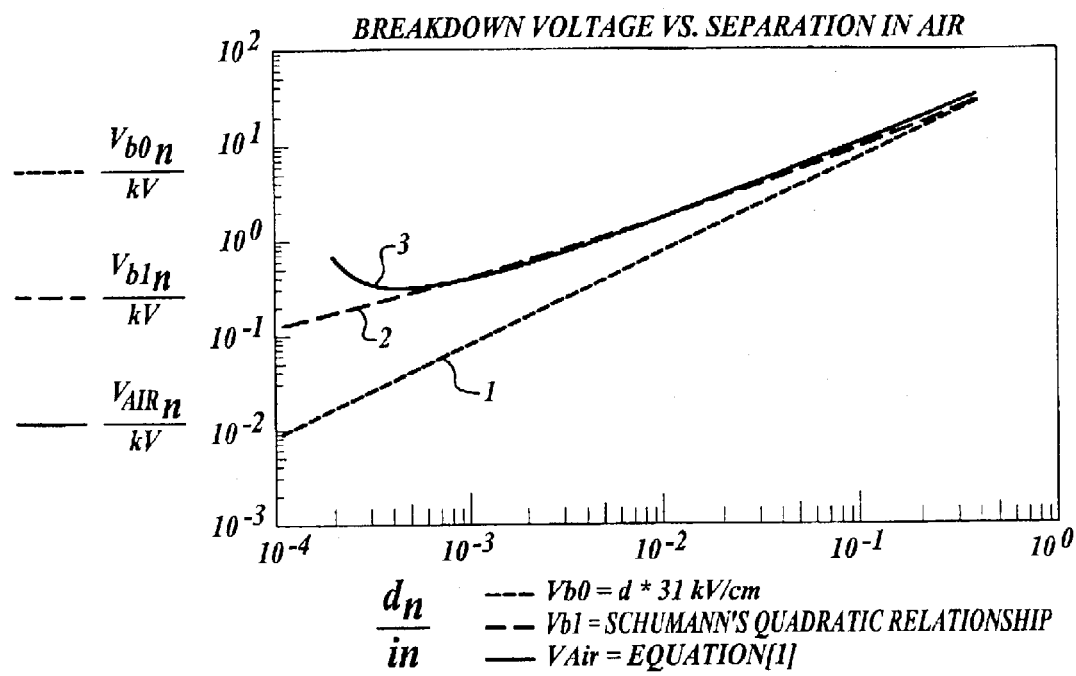
FIG. 1 is a plot of the dielectric breakdown voltage of air versus contact separation.

The physics of the dielectric breakdown voltage of air is more complex than it may appear at first glance. Three different curves for the breakdown voltage across plane electrodes in air at standard pressure and temperature are shown in FIG. 1, with the Y axis in Kilovolts and the X axis in inches. The lower dashed line 1 is the simple linear approximation reached by multiplying an assumed constant field strength (e.g., 31 kV/cm) times the distance. As shown, it becomes approximately accurate at distances over 1 cm but is quite in error at smaller separations. The upper dashed line 2 is a quadratic approximation by Schumann given in some textbooks and the third solid line 3, is the best known curve for smooth plane electrodes. This curve is known as Paschen's curve and is in good agreement with measured data. This curve shows a minimum breakdown voltage at about 0.5 mils of just over 300 volts. This is known as the "Minimum Sparking Potential". It is real and the breakdown voltage actually does rise steeply below this separation. At separations less than 0.12 mils, the breakdown voltage drops again and becomes approximately linear with distance to zero volts.

With plane electrodes then, one would not expect arcing to occur at standard line voltages of 167 volts peak, or even phase-to-phase voltages differences of 204 volts peak (three-phase), unless the contacts are closer together than 0.12 mils. This graph, however, applies only to plane electrodes. Real contact points usually have small protrusions and sharp edges that increase the localized electric field strength and lower the effective breakdown voltage. Also, inductive loads produce large oscillatory voltage transients when the current is switched on or off, sometimes reaching a thousand volts or more. Even the inductance of a single long power feed can be sufficient to produce a voltage transient several times the line voltage when a high current load is turned on or off.

MED Tool

Figure 2:
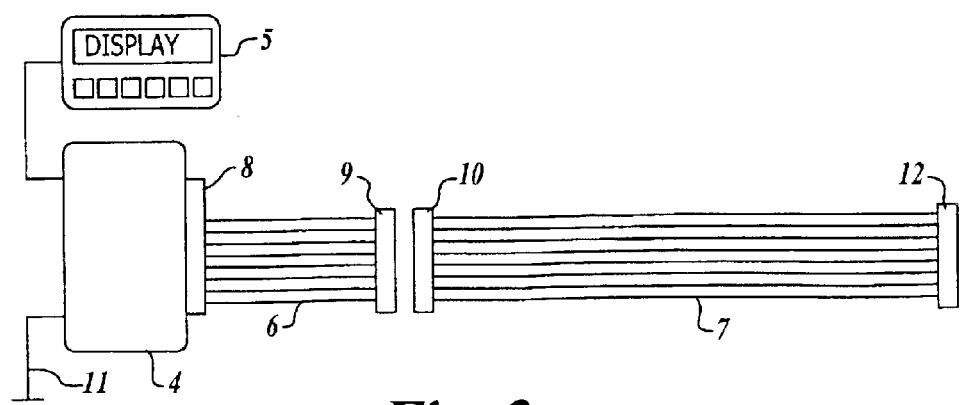
FIG. 2 is a simplified diagram of the Micro-Energy Dielectric (MED )Tool.

FIG. 2 shows a block diagram of the preferred embodiment of the Micro-Energy Dielectric Tool or the MED tool. A portable enclosure 4 contains a microprocessor control system, the power supply and analog circuits. All circuits operate off an internal rechargeable battery. A detachable module 5 contains a keyboard/display for entry of parameters and user display. The MED tool 4 connects to a cable harness 7 using a connector adapter 6. The adapter 6 provides a mating plug 9 to mate with the harness connector 10. The number of pins in connector 8 is the maximum number of conductors that the unit is capable of testing at one time. Thus, adapters can be provided with up to this number of pins.

In operation, the cable harness 7 must be floating, i.e., connector 12 and any other connections that branch off the harness must be disconnected. Also, in order for the unit to be able to detect parallel faults to ground, the MET must be connected to the airframe using a grounding wire 11.

Figure 3:
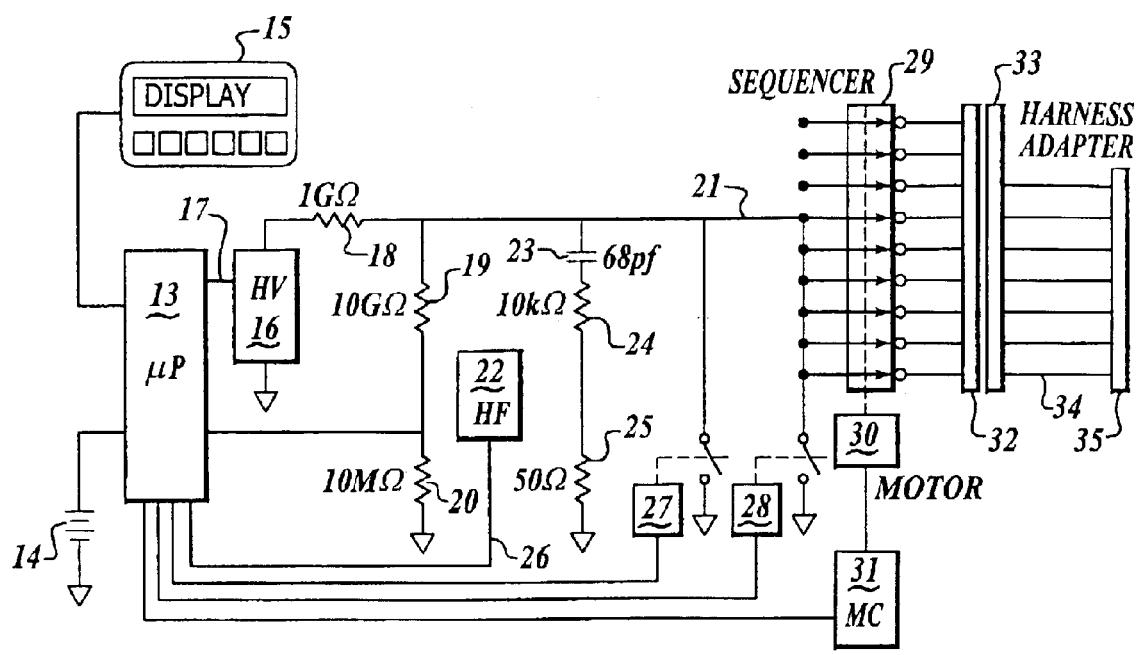
FIG. 3 is a simplified schematic of the Micro-Energy Dielectric (MED )Tool.

A schematic block diagram of the MED tool is shown in FIG. 3. The microprocessor 13 represents a control system that includes a microprocessor, interfaces and analog circuits. The entire system is powered by a rechargeable internal battery 14. The separate keyboard/display unit 15 connects to the unit with a serial RS232 link. A low-current, high-voltage switching supply 16 produces a DC output voltage that is proportional to a control voltage 17 produced the microprocessor. In this manner, the microprocessor can set the high-voltage as required by the measurement. The maximum voltage should be on the order of 1000V to 6000V, depending on the application. A variety of suitable high-voltage supplies are available from EMCO High Voltage Corporation, Sutter Creek, Calif. A high-valued resistor 18 limits the maximum current and makes the high-voltage supply 16 act like a current source for low resistance loads. For example, a 5000 volt supply with a 1 Gigohm resistor will limit the maximum current to 5 microamps. When this is applied to a wiring harness it will only charge a selected wire to high voltage if there is no load attached. If a real load having a DC resistance of less than, say, 100 kilohms remains inadvertently attached, the load will see a constant current of only 5 microamps and this will produce a maximum voltage rise of only a few hundred millivolts. Two resistors, 19 and 20, form a voltage divider to allow the microprocessor to monitor the voltage at point 21.

The combination of the DC supply 16 and a high-value resistor 18 is referred to in this patent as a current source which is commonly understood to mean a constant-current source. In this case, it is simply a DC supply with a resistor, not a constant-current source. The DC supply and resistor will produce an exponential charging ramp. A real constant-current source would produce a linear ramp, which may provide some advantages such as simplifying some calculations. The reasons that the DC supply resistor combination is used in the preferred embodiment is that it is generally more difficult to implement a constant-current source at these high voltages. The use of a real constant-current source is, however, within the scope of this patent.

A high-speed timing circuit 22 is provided to measure the pulse width of the incident and reflected waveforms in order to determine the distance down the harness the arc originates. A high-frequency coupling network consisting of 23, 24 and 25 couples the signal to the circuit 22 and the output of the circuit 26 is a DC level proportional to the distance. The operation of this timing circuit 22 will be discussed in more detail later.

A first relay 27, controlled by the microprocessor 13, serves to short the output 21 to ground. A second relay 28 serves to allow the microprocessor 13 to float the normally grounded wires for purposes of determining whether the short is between wires or from a single wire to ground.

Figure 4A:
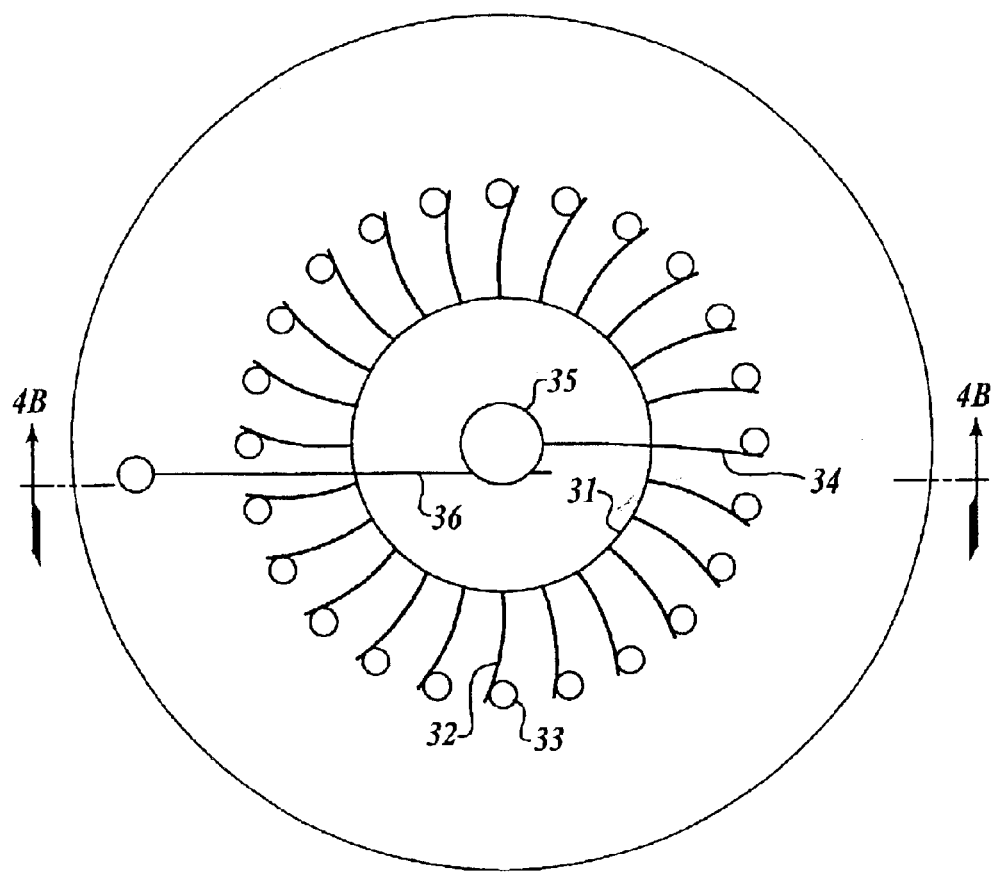
FIG. 4 is a simplified mechanical drawing of the Sequencer used in the MED tool.
Figure 4B:
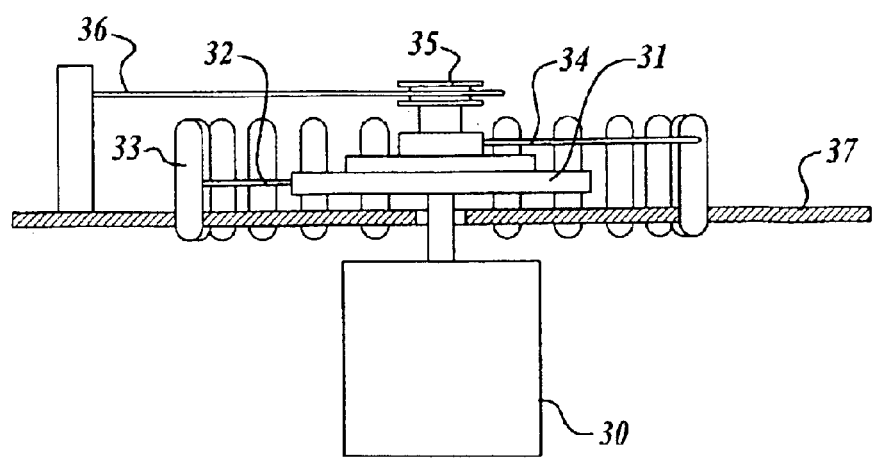

The sequencer 29 is a specialized stepping relay that serves to connect the output 21 to a single pin on the connector 32 while grounding all the other pins. The relay is advanced by a stepping motor 30 under control of the microprocessor 13 by way of a stepping motor controller 31. One mechanical implementation of this sequencer is shown in FIG. 4 and will be discussed next. The harness adapter 34 serves to provide a connector 35 that mates to the harness to be tested. The number of pins on the harness can be up to the number of pins on the MED tool connector 33. In operation, the number of pins is inputted to the microprocessor and it controls the sequencer to switch between these pins only.

FIG. 4 shows the top and side views of a mechanical sequencer. A stepper motor 30 rotates a metal disk 31 that has flexible wires 32 which contact vertical pins 33 set into a circuit board 37. The metal disk is electrically connected to the relay 28 (FIG. 3) and each vertical pin connects to a pin on the connector 32 (FIG. 3). One of the flexible wires 32 on the disk 31 is missing to allow a separate flexible wire 34 to contact the pin at that position. This wire is attached to a slip ring 35 that is electrically isolated from the disk 31 and connected via a contact 6 to the output 21 (FIG. 3) of the MED tool. The stepper motor is made to turn in a counter-clockwise direction only and the step size selected to align with the pins. In this manner, each time the motor is stepped, it advances one pin, applying the output 21 (FIG. 3) to a single wire and grounded all the rest of the wires. Some feedback mechanism, not shown, must be included to allow the microprocessor to know where the starting point is.

Figure 5:
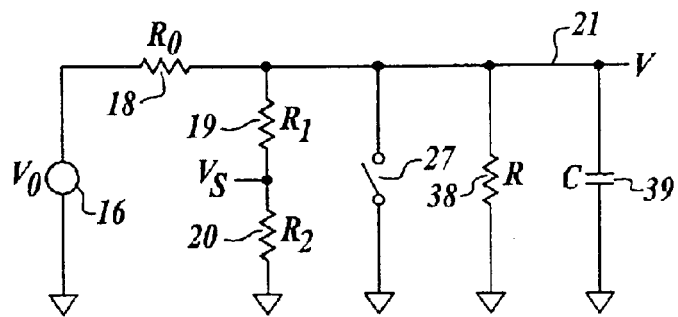
FIG. 5 is an equivalent electrical circuit of the MED tool.
Figure 6:
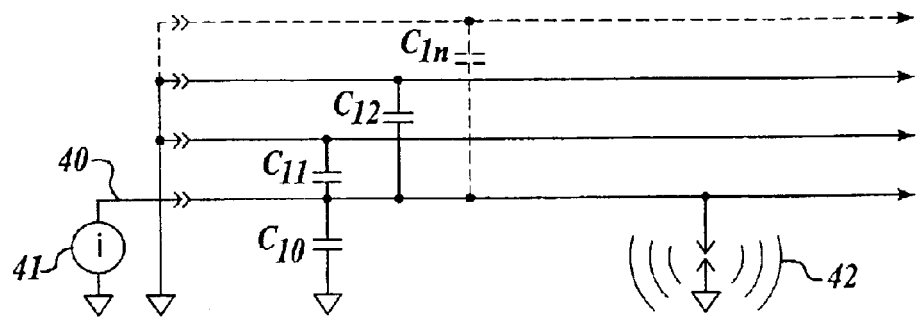
FIG. 6 shows the high-voltage ramp during measurement.

FIG. 5 shows a simplified equivalent circuit of the MED tool with the numbers of the components corresponding to the numbers in FIG. 3. The resistor R 38 represents the insulation resistance and the capacitor C 39 represents the total capacitance between the WUT and ground. A simplified equivalent of the capacitors inherent in a cable harness is shown in schematic form in FIG. 6. The quasi-current source 41, formed by the high-voltage supply 16 (FIG. 13) and resistor 18 (FIG. 3), connects to the WUT 40. $C_{10}$ represents the total capacitance between the WUT and ground. $C_{11}$ represents the total capacitance between the WUT and the next wire in the bundle and so on through $C_{1n}$ for the nth wire. The total capacitance C is thus the parallel sum of all these capacitors. In FIG. 6 a parallel fault 42 is shown from the WUT to ground.

Figure 7:
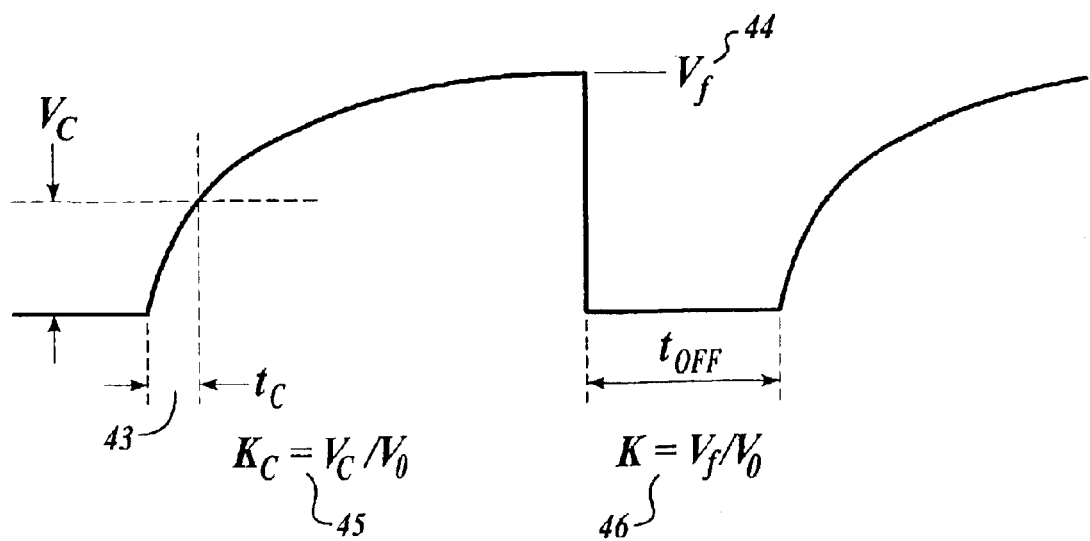
FIG. 7 is an equivalent electrical circuit of the harness under test.

FIG. 7 shows a waveform of the voltage at the output 21 during a test cycle. Prior to the point 43, the relay 27 keeps the voltage at zero. At the point 43, the relay 27 opens and the current begins to charge the capacitance C 39. The final voltage $V_f$ 44 is the steady-state voltage level. If we let the constant K 46 equal $$K = \frac{V_f}{V_0}$$

where $V_f$=Steady-state voltage
$V_0$=HV supply voltage then the insulation resistance R 38 can be calculated with the following equation:

$$R = R_0 \frac{1}{\frac{1}{K} - \frac{R_0 + R_1 + R_2}{R_1 + R_2}}$$

Figure 8:
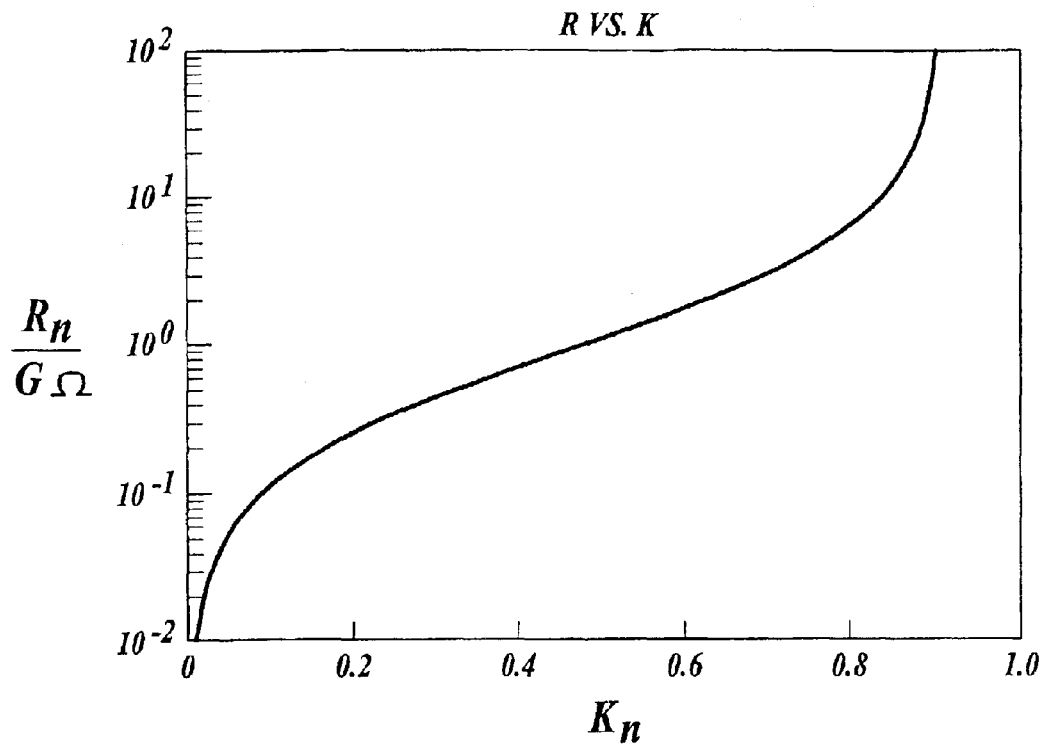
FIG. 8 is the transfer response for Insulation Resistance measurement.

In operation $V_f$ is measured first via the voltage divider consisting of $R_1$ 19 and $R_2$ 20, then K is calculated and then R. The transfer response with the component values of FIG. 3 is shown in FIG. 8. The vertical axis shows the insulation resistance R in gigaohms and the horizontal axis shows K. The non-linear character of the curve advantageously provides good resolution in the range of 100 Megaohms to 10 Gigaohms, while extending beyond in both directions with less resolution.

Referring back to FIG. 7, the capacitance C 39 (FIG. 5) is measured in the following manner. During the charge ramp starting at point 43, the microprocessor monitors the voltage at point 21 (FIG. 3) using the voltage divider and detects the time $t_c$ at which this voltage reaches a voltage level $V_c$ that is some preselected fraction of $V_0$ 16 (FIG. 5). We now let $K_c$ 45 equal that fraction $$K_C = \frac{V_C}{V_0}$$

where $V_c$=Threshold voltage
$V_0$=HV supply voltage and we get an equation for the capacitance C as a function of the measured delay $t_c$.

$$C = \frac{-t_C}{\ln\left[1 - \frac{K_C}{K}\right]KR_0}$$

Figure 9:
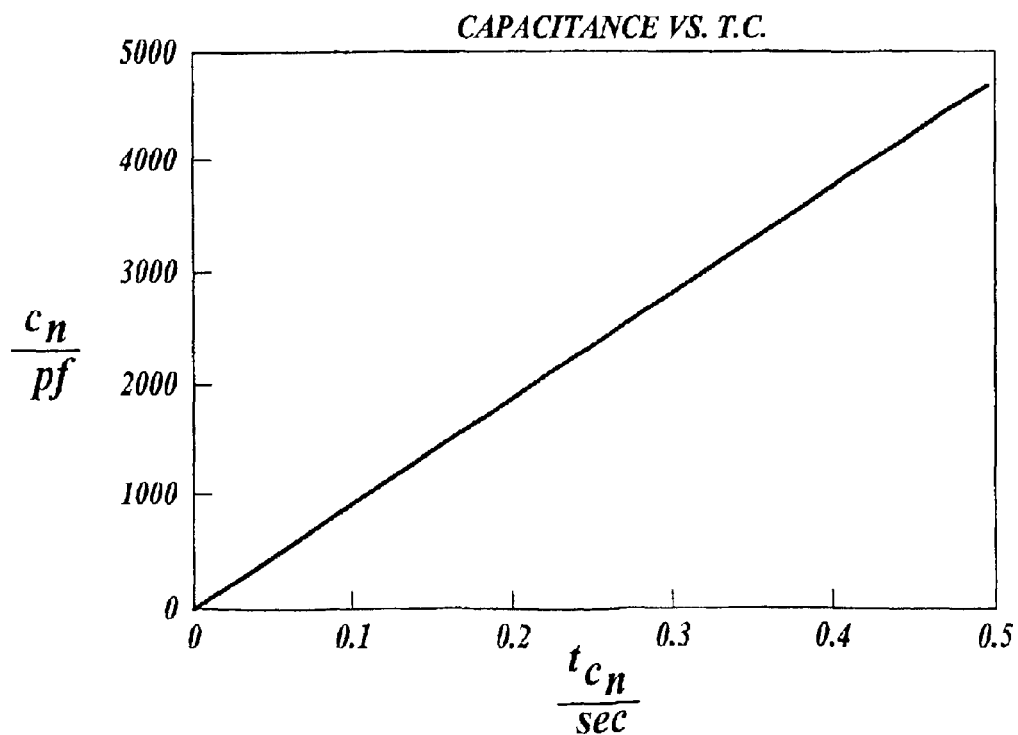
FIG. 9 is the transfer response for Capacitance measurement.

As shown in FIG. 9, the transfer function of this equation with the components values of FIG. 3 and $K_c$ selected to be 0.1, is linear and can provide a precise measure of the total capacitance C.

If $K_c$ is selected to be a low value, the capacitance can be measured before the voltage rises to a very high level. This can be used to calculate the maximum energy that will be dissipated in the event that an arc occurs using the following equation $$E = \tfrac{1}{2}CV^2$$

where

C=the measured total capacitance
V=the applied voltage

When an arc occurs, the user display thus shows both the capacitance and the total energy produced by the discharge.

High-Speed Circuit

Figure 10:
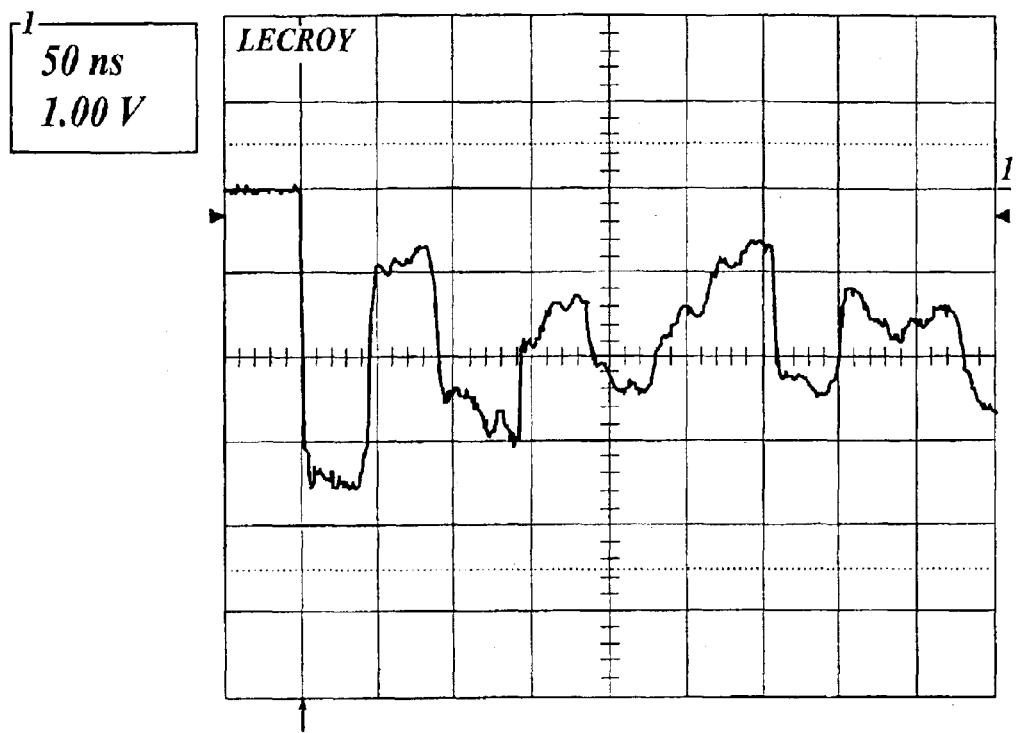
FIG. 10 is the high-speed input signal for an arc 13.7 feet down a 56 foot harness.

Referring again to FIG. 3, a second basic functional block of the MED tool is the high-speed circuit 22 that enables the device to measure the distance down the cable to the fault. The input to this circuit is a high-speed circuit taken from the WUT at point 21 via a 200:1 AC voltage divider formed by resistors 24 and 25. Careful layout and shielding must be employed to allow this divider to operate effectively at up to 1 GHz. The scope traces shown in FIGS. 10 and 11 were obtained by feeding the 50 ohm output from this divider directly into a 50 ohm, 1 Ghz bandwidth oscilloscope. The first trace, shown in FIG. 10, shows the signal produced by a first micro-energy arc discharge 13.7 ft down a 56 ft cable harness. The harness is a twisted triplet of 10 gauge, Teflon-insulated aircraft wires. The vertical scale is 200 volts/div and the horizontal 50 ns/div. The width of the initial negative pulse is about 40 ns which is twice the transit time for 13.7 ft. FIG. 12 shows the same harness with a second micro-energy arc discharge produced 48 ft down the cable harness. In this case, the initial pulse width is seen to be 136 ns, or twice the transit time for 48 ft. The purpose and function of the high-speed circuit 22 (FIG. 3), therefore, is to measure the width of this initial pulse and, from that measurement, calculate the approximate position down the harness where the fault is located.

The present inventor has made a theoretical analysis of the signal propagation in this case where the signal edge originates in the middle of a wire harness and the basic process that enables determining the distance to the fault can be described. When the charge on the cable capacitance, resulting from an applied voltage V, discharges into the arc, the voltage at the arc drops from V to zero in a fraction of a nanosecond. This produces a negative traveling wave, i.e., from 0 to –V volts, that proceeds in both directions down the cable from the position of the arc. At the MED tool, the first indication of a signal will be when this traveling wave reaches there, at which time the voltage will abruptly go from V to –V, a negative-going edge that has twice the amplitude of the original edge at the arc. The time elapsed, Δt, from the firing of the arc to this first edge reaching the MED tool is the cable length divided by the propagation speed of the traveling wave. The propagation speed, though dependent on the physical properties of the insulation and the distribution of the wires, is most likely in the range of 0.6–0.7 times the speed of light. The speed of light in free space is 0.984 ft/ns. In the case of the test harness used to produce FIGS. 10 and 11, the speed was measured to be 0.685 ft/ns or about 0.7 times the speed of light. At this point, because the traveling wave sees a high-impedance at the MED tool, the wavefront is reflected back down the harness without inversion, i.e., with a reflection coefficient approaching +1. In a second Δt time interval the reflected wavefront will return back down the cable and arrive again at the arc. Now because the arc itself forms a low-impedance—lower than the characteristic impedance of the effective transmission line—the signal reflects once more at the arc and travels back towards the MED tool, but this time with inversion. Since the impedance is not actually zero, the reflection coefficient at this point is not –1 but a little less, perhaps –0.75. This process repeats, producing more reflections that extend the received waveform but it is only the width of the first negative-going pulse that is of interest, this width being equal to twice the transit time of the edge from the arc and thus proportional to the distance.

Figure 11:
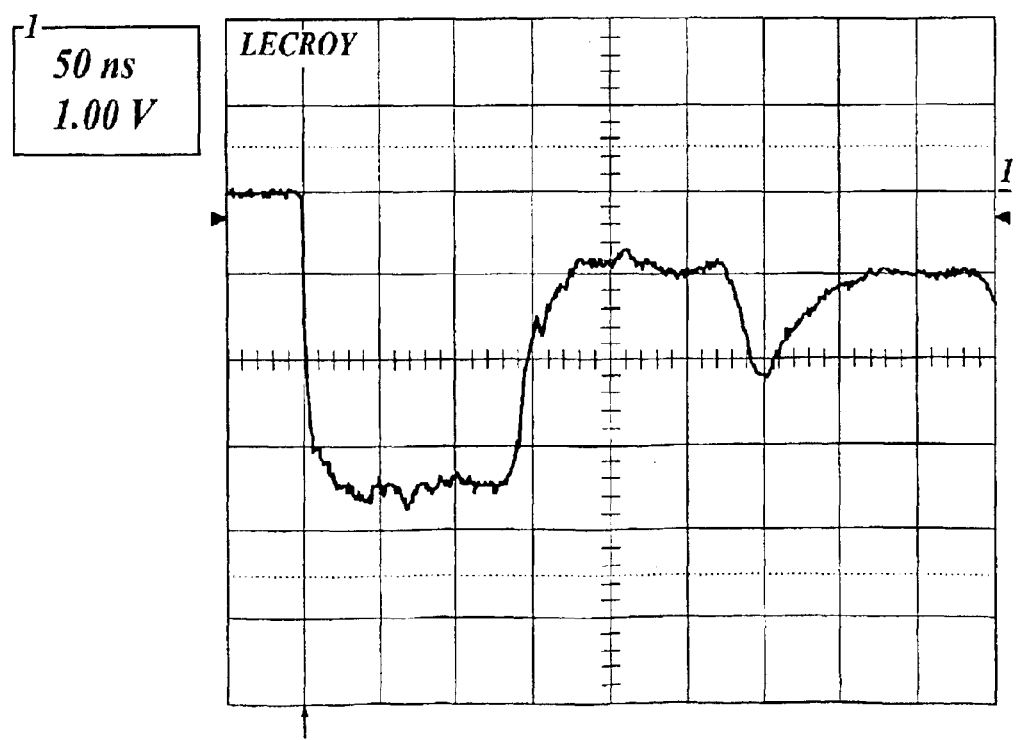
FIG. 11 is the high-speed input signal for an arc 48 feet down a 56 foot harness.

The novel charts in FIGS. 12 and 13 explain more thoroughly the signal propagation, reflections and resulting waveform construction in the cases of FIG. 10 and 11, respectively. Referring first to FIG. 12, we see as the center trace $i_{arc}$. This is a plot of the current through the arc which is, in this case, located 13.7 ft down a 56 ft harness. The arc current initially rises at time=0 as shown on either of the two time axes at the top and bottom of the chart. This current through the arc results from the effective transmission lines on each side of the arc discharging into the arc. Thus, $i_{arc(start)}$ is a plot of the current flowing from the portion of the cable harness extending from the start of the harness to the arc and $i_{arc(end)}$ is a plot of the current flowing from the portion of the cable harness extending from the arc to the end of the harness. The second trace from the top, labeled Distance, shows the progression of the traveling wave edge, starting at the arc at 13.7 ft and bouncing back and forth to the start of the cable at 0 ft. A mathematical analysis by the present inventor of the static conditions just before and after the arc initially fires shows that the arc firing produces two negative steps of amplitude −V, one traveling in each direction away from the arc. In the case shown in FIG. 12, we have an initial applied voltage of +800 volts and, therefore, when the arc strikes we get a first −800 volt edge traveling towards the start of the cable, as indicated by the edge symbol with an arrow through it just to the right of the upper distance axis, and a second −800 volt edge traveling towards the end of the cable, as indicated by the edge symbol near the lower distance axis. Referring back to the upper distance plot, when this edge arrives at the start of the cable, which is a high relative impedance, we get a positive reflection with a reflection coefficient ρ=+1, and the 0 to −800 volt edge proceeds back towards the arc. The effect of this edge reflecting off the start of the cable is to cause the voltage to go from its original +800 volts to the −800 volts of the traveling edge. This produces the first 1600 volt negative edge one would observe at the start of the cable, as indicated by the upper trace labeled $V_{start}$. Note the time axis on the top shows that 19.3 ns has elapsed at this point. The 0 to −800 volt edge now proceeds back towards the arc as indicated on the upper distance plot. When it reaches the arc, because the arc is a relatively low impedance, the edges experience an inverting reflection, this time with a reflection coefficient ρ=−0.75. This 0 to +600 volt edge now travels back toward the start of the harness. When it arrives, it causes the waveform at $V_{start}$ to rise back up, but not quite back to the starting voltage because of the reduced reflection coefficient at the arc. The pulse width, shown as $\Delta t_{arc}$, is thus equal to twice the transit time for the traveling wave to span 13.7 ft. It should be noted that, as shown on the lower half of the chart in FIG. 12, a similar waveform is produced at the other end of the cable harness, the width of the first pulse being proportional to the distance from the arc to the end of the harness.

FIG. 13 shows the same similar chart, but for the waveform depicted in FIG. 11. In this case, the arc is located 48 ft down the same 56 foot long harness. The explanation follows from the above description.

The actual circuits used to detect this pulse width are standard and can be developed by anyone skilled in the art of high-speed design. The most direct approach is to use an integrator to charge a capacitor during the pulse interval and then hold the charge so as to produce a DC voltage level proportional to the pulse width. Inexpensive comparators are now readily available with response times on the order of 1 ns, permitting a distance resolution on the order of 1 foot.

As noted, the received waveforms shown in FIGS. 11 and 12 were taken on a twisted triplet of wires, one wire being the WUT, another connected to ground, and the third wire floating. If this third wire is instead connected to ground, the amplitude of the first pulse will be attenuated because grounding the wire causes an inversion on its reflection of the coupled signal. While the width can still be measured, it may be, in some cases, desirable to provide a sequencer that is capable of producing the best possible signal. To achieve this, the sequencer must be able to connect each wire either to power, to ground, or leave it floating. The sequence of operations in this case is as follows:

1. First ground all the wires except the WUT and apply the current ramp to the WUT.
2. If a break over is detected, then lift all the grounds and apply the ground successively to each wire until the arc reoccurs. This locates the wire that the WUT is arcing to. If none produce the arc, the fault must be an arc to the frame.
3. Now float all the wires except the two wires involved and measure the distance to the arc.

This method produces the best waveforms but requires a more complex sequencer.

MED Tool Operation

The MED tool may thus used in the following manner. First, the MED tool is situated at and connected to one end of a cable harness using the appropriate connector adapter. Using the attached keyboard/display unit, the user then programs the desired operational mode, the maximum test voltage and other parameters relating to the test sequence. Once started, the MED tool will automatically sequence through all of the conductors in the harness and collect data to calculate the Insulation Resistance and Capacitance of each wire. These can be viewed on the user display or output to an external printer or computer. If a fault occurs, the MED tool will identify the conductor, display the energy produced and attempt to measure the pulse width of the reflected waveforms. If successful, it will automatically display the approximate distance to the fault.

EML Tool

The Electromagnetic Locating Tool is a portable diagnostic tool used for locating arcs in two or three-dimensional space based on timing the difference in arrival times of the radiated electromagnetic edge. It can be used in conjunction with the MED tool to locate a micro-energy arc or as a stand-alone diagnostic tool to detect and locate electrical arcs.

Figures 14A, 14B, 14C, 14D, 14E:
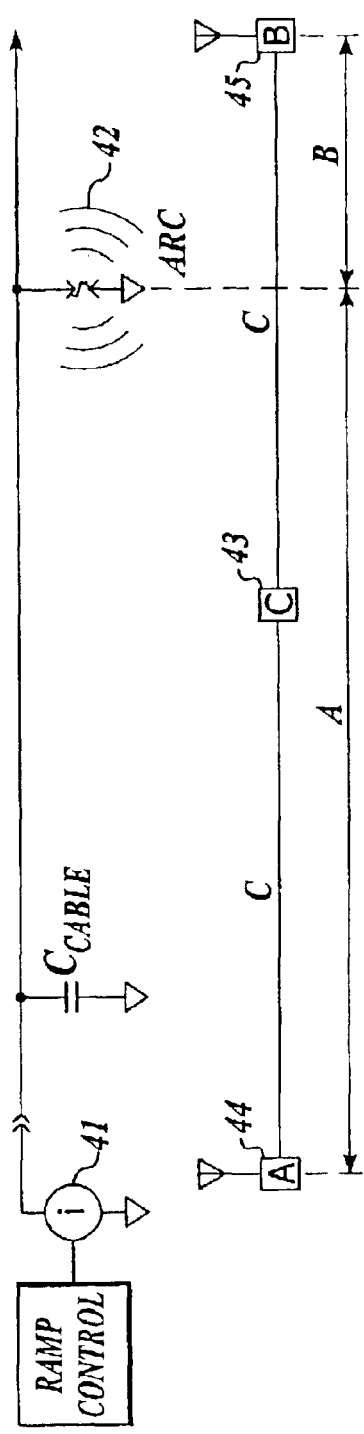
FIG. 14 is a simplified diagram of the Electromagnetic Locating (EML) tool together with signal timing.

Referring now to FIG. 14, a simplified representation of a harness connected to an MED tool that is producing a micro-energy arc 42 is shown at the top of the figure. The two dimensional EML tool consists of 3 separate portable units—a controller unit and two separate Receiver units. The controller 43 is held in hand by the user, and the Receiver units 44 and 45 are placed somewhere near or beyond the ends of the harness under test. The two Receiver units 44 and 45 each have an antenna to receive the electromagnetic radiation and are each connected to the controller unit 43 by a coaxial cable. When an arc strikes, the fast falling edge produced will be both conducted down the harness in both directions away from the arc and radiated into space in all directions. The energy traveling through space will propagate at the speed of light while the energy traveling along the harness will move at about 60–70% of this speed.

In FIG. 14, the distance from the arc to the Receiver unit labeled A 44 is shown as A and the distance from the arc to the Receiver unit labeled B 45 is shown as B. The lengths of the coaxial cables are made equal and shown as C. When the arc strikes, the leading edge of the discharge will propagate into space at an initial time 0 shown at 46. At a time $b=B/\partial$ where $\partial$ is the speed of light, Receiver B will receive the impulse 47, use threshold detection to convert it to a digital pulse, and forward the digital pulse to the controller through the coaxial cable. The controller receives the digital pulse 49 at a time c=C/Φ later, where Φ is the propagation speed in the coaxial cable. Receiver A sees the same radiated impulse 48 from the arc at a later time a =A/∂, converts it to a digital pulse and forwards it on to the controller arriving as shown at 50. Though we cannot know the time 46 that the arc actually struck, we can measure the difference in time between the two received pulses, i.e., the time a–b. By making the two receivers identical circuits to produce equal processing delays, and the two coaxial cables the same length, these added delays are cancelled out in the difference.

Figure 15:
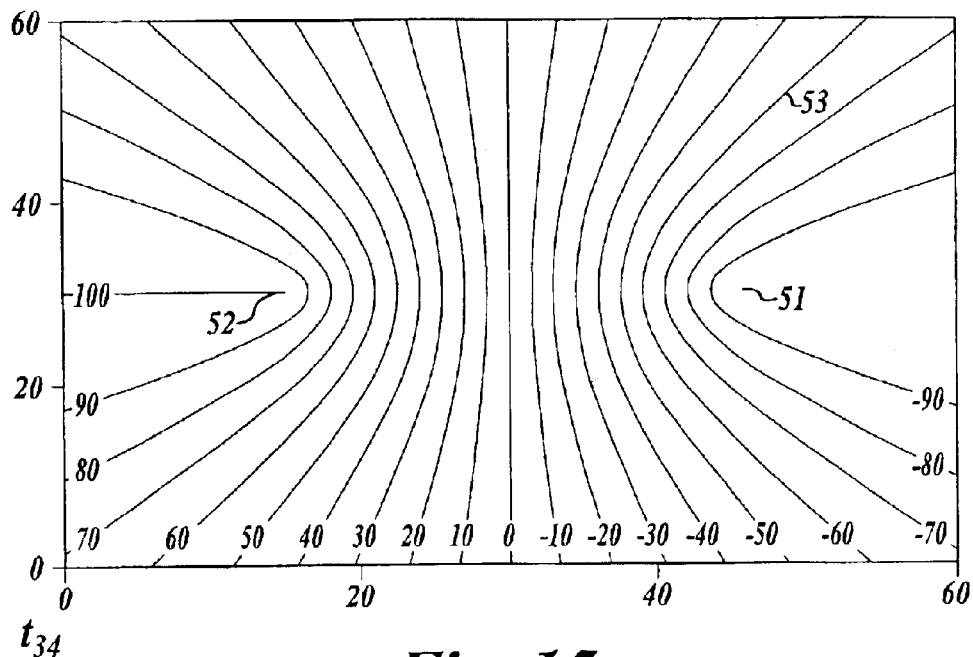
FIG. 15 shows a contour plot of constant time differentials for a two-dimensional locating system.

If a is equal to b, then the arc is clearly equidistant from the two antennas. If a is greater than b, then the difference will be positive, and if a is less than b, the difference will be negative. The contour plot shown in FIG. 15 shows all possible arc positions given the difference in time, a–b. In this plot, the antenna for Receiver A is at the right focus 51 and the antenna for Receiver B at the left focus 52. Each contour line 53 represents a constant difference in time between the received pulses as indicated in nanoseconds on the line. Since light travels at approximately 1 ft/ns, these labels in nanoseconds also represent the distance in feet. Thus, if the difference in time, a–b is zero, the arc could lie anywhere on the central vertical contour line labeled 0. If this difference is –50 ns, the arc could lie anywhere on the curved contour line to the right and so forth. On the axis between the two antennas this difference in time provides a direct linear measure of the distance from the center point to the arc.

Figure 16:
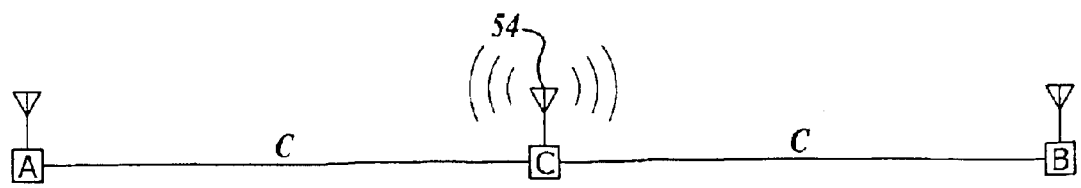
FIG. 16 shows the calibration transmitter for the EML tool.

By adding an impulse transmitter 54 to the handheld controller, as shown in FIG. 16, the system can be automatically calibrated to display the distance from the handheld controller to the arc. An equally sharp calibration edge is produced at the handheld controller and received by the two receivers. An offset is then added to the measured difference in time to force the difference to zero. Future measurements that include this offset will now indicate the distance from the controller to the arc. The calibration transmitter can be made by discharging a section of transmission line using an arc or by any other means that produces a high-amplitude edge with a transition time on the order of 1 ns or less.

The circuitry in the receivers is straightforward and can be designed by anyone skilled in the art of radio frequency and high-speed circuits. It consists of an antenna impedance matching network followed by an amplifier, if necessary, and then a comparator threshold circuit designed with hysterisis to convert the received impulse into a digital pulse. It is advantageous to include logic to limit the output to a single pulse regardless of multiple transitions across the threshold that may follow immediately after the initial pulse due to multiple reflections and ringing.

If two receivers do not provide enough information to locate the arc, additional receivers may be used. For a given temporal difference, the arc may lie anywhere along the respective contour line. If the two receivers are placed at the approximate ends of a long cable harness, as might be the case along the length of a commercial airliner during a heavy-check procedure, this may be enough information to locate the arc. If not, the addition of another set of antennas can serve to positively locate the arc in two dimensions.

Figure 17:
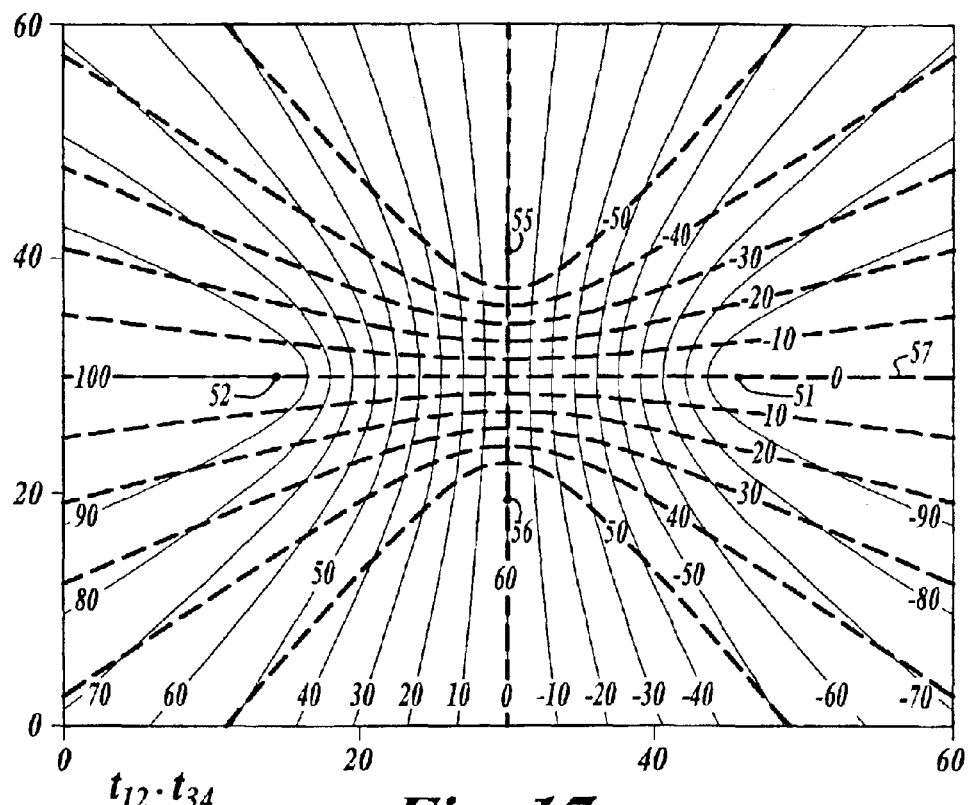
FIG. 17 shows a contour plot of constant time differentials for a three-dimensional locating system.

Referring now to FIG. 17, we see a second pair of receivers 55 and 56 positioned along an axis that is perpendicular to the axis of the original two receivers, 51 and 52. This second set of receivers produces a second set of contour lines 57. Now, when an arc is sensed by all four receivers, we get two time differences and two contour lines, the intersection of which positively locates the arc in two dimensions. The addition of yet another pair of receivers can serve to locate an arc in three dimensions. In fact, any number of receiver pairs can be used, each pair providing an additional set of contour lines to aid in defining the location of the arc.

The impulse signal received by multiple receivers, though from the same source, will invariably look different as they reach the antennas due to a couple of influences that distort the signals. First, the signal arriving at each antenna will likely experience different reflection surfaces leading to different multipath distortions. Secondly, since the cable harness is not a shielded transmission line, it will transmit some energy both at impedance discontinuities and, to some extent, along its entire length. The information of interest, however, is just the leading edge of the impulse and this will arrive at all the antennas before any of the delayed signals thereby making what follows irrelevant. The threshold circuits in the receivers should be adjusted to just above the background noise level in order to pick up the leading edge as quickly as possible.

The receiver circuits are designed to detect any fast edges and are, therefore, responsive to external noise, particularly noise produced by normal arcing processes, such as commutator brushes and contact arcing. For this reason, the spatial system is intended for use in a relatively quiet electrical noise environment, such as during a heavy-check procedure when most or all airplane circuits can be off except the particular circuit branches under test. Using two pairs of receivers or more, however, does provide the unique ability to determine whether each arc originates within the airplane being tested or from without. If it is found to originate from without, it can be rejected as extraneous.

The onset of an electrical arc is characterized by an extremely fast rise in current as the first electrons cross the gap. In U.S. Pat. No. 5,434,509, issued Jul. 18, 1995, to the present inventor, he discussed how this rapid dI/dt alone could be used to identify an arc.

"In terms of arc detection, the fact that the rise in current at the initiation of the arc is inherently extremely rapid can be used by a detection mechanism to distinguish this current from other currents resulting from extraneous noise sources."

Another degree of extraneous noise rejection can thus be achieved by making the receivers responsive only to edges with a predetermined rise time or less. in other words, potential electromagnetic interference from radio stations and the like can be rejected by making the receivers responsive only to edges with a certain risetime or less. This is roughly equivalent to adding a high-pass filter to the receivers to reject lower frequency signals.

The preferred embodiment of the EML tool is a battery powered microprocessor-based tool consisting of a handheld controller and one or more pairs of miniature receivers with built-in antennas. Each receiver is connected to the controller with a coaxial cable. The controller has a keyboard/display for user interface, a printer output and a communications port that enables it to be connected to a laptop computer, and a calibration impulse transmitter. When using a single pair of receivers, the controller measures the difference in arrival times between the two receivers, calculates the relative distance from this difference, and then indicates on the user display the linear distance from the controller to the arc with the polarity indicating the direction along the axis between the two antennas. By making the two coaxial cables the same length, the additional delay due to the length of the two cables simply cancels in the difference. Additional delays due to circuits in the receivers can be largely canceled by making the receivers identical.

When using more than one pair of receivers, the controller measures and calculates multiple relative distances, one for each pair of receivers, and then forwards these results to the optional connected laptop computer. A separate program on the laptop processes this data to calculate a set of contour lines, one line for each set of receivers, and then calculates the intersection of these contour lines to locate the arc. The location of the arc, relative to the known positions of each of the receivers, can then be displayed on a graphical display.

The EML tool could be used to advantage inside an aircraft during a heavy check procedure as a non-intrusive method to detect and locate electrical arcs as individual circuits are turned on and off. By keeping most electrical systems off, and turning one on at a time and then off, the background noise can be kept to a minimum. Using the graphical display capabilities of the attached computer, the spatial arc method could be used to indicate on one or more outline drawings of the aircraft the location and timing of each and every arc it detects, including the transient arcs that occur whenever a power switch is turned on or off.

USL Tool

A third and final means of locating an arc is based on a simple principal akin to gauging one's distance from a thunderstorm by timing the gap between the lightning and the thunder. The Ultrasonic Locating Tool, or USL tool is a small, handheld device that contains both an ultrasonic receiver mounted on the front to receive ultrasonic emissions from the arc and an antenna to receive electromagnetic emissions from the arc. Because the electromagnetic front travels so very much faster than the sound, the delay between the two will be proportional to the distance to the arc.

$$d_{arc} = v_{TP} \Delta t$$

where $d_{arc}$=distance to arc $v_{TP}$=speed of sound at temperature T, pressure P $\Delta t$=time between leading edge of electromagnetic pulse and sonic pulse The ultrasonic wavefront is produced by the extremely rapid ionization of the air molecules. With the microjoule discharges used in this system, one can just hear a "snap" each time it fires and much of this energy in this impulse is in the ultrasonic frequency range. There are several advantages to monitoring in the ultrasonic region. First, ultrasonic waves are highly directional and this characteristic can be used to help locate the arc. An option is to add a small laser pointer that is aligned with the peak reception direction of the ultrasonic transducer. If the device provides some sort of signal strength indication, then at the direction of maximum strength, the laser will point to the arc. Second, the background noise in the ultrasonic region is low. Items like zippers and removing tape produce ultrasonic energy, but normal conversation, for example, does not. In the controlled environment of a non-energized aircraft, the ultrasonic background noise should be low. And third, ultrasonic frequencies of 40 khz and higher are high enough to get resolution in inches.

Either piezoelectric or electrostatic ultrasonic transducers may be used. The preferred embodiment uses an electrostatic transducers, like the one manufactured by Polaroid, because of its low Q, short ringing times, and high sensitivity resulting from a better inherent impedance match to air. Well-known techniques for echo ranging with ultrasonic transducers are used to enhance the detection range. For example, a time-dependent gain ramp is employed to compensate for both square-law dissipation and acoustic losses as the ultrasonic signal propagates. Since the time the arc tires is known from the reception of the electromagnetic impulse, the circuit simply begins ramping the gain at that time.

Figure 18:
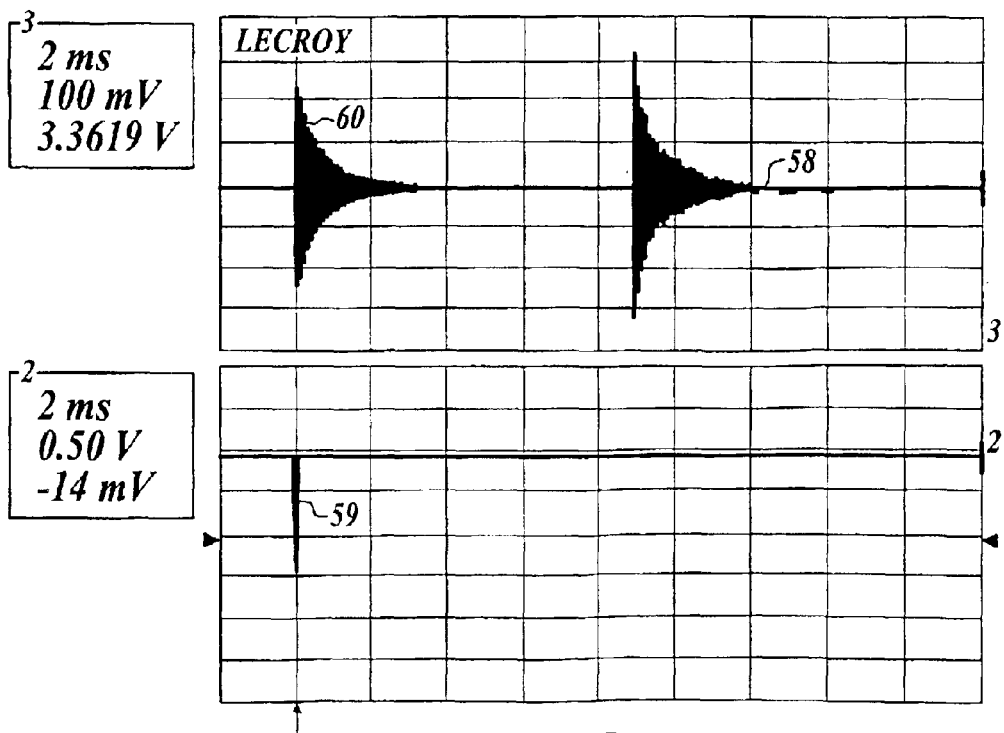
FIG. 18 shows the signal timing for the Ultrasonic Locating (USL) tool.

A prototype was built using a Polaroid instrument-grade electrostatic transducer and a modified Polaroid #615077 ranging amplifier. FIG. 18 shows both the electromagnetic and the ultrasonic signal from a micro-energy arc 10.8 ft (130") away. The top trace 58 shows the amplified sonic signal and the bottom trace 59 the electromagnetic impulse. In this test, the electromagnetic pulse was detected by feeding a 3" wire antenna directly into channel 2 of the oscilloscope with no external amplifier. The acoustic ringing 60 at the time of the electromagnetic impulse is due to electronic reception of the EMP at the electrostatic transducer and subsequent ringing of the tuned circuits within. This needs to be minimized in order to allow measurement of the distance to the arc at close range, say an inch or so. The preferred approach is to electrically clamp the transducer to ground during the electrostatic impulse. The best way to do this is to simply leave it clamped to ground at all times except for a period of time after reception of an electromagnetic impulse when reception of an acoustic wave is expected.

When using the USL tool together with the MED tool, the latter is placed in a repetitive discharge mode wherein the micro-arc is made to repeat at a predetermined repetition rate of perhaps once per second. The technician then points the USL tool towards the area of the arc, notes the distance to the arc and moves in such a manner as to minimize the displayed distance.

While the preferred embodiment of the invention has been illustrated and described, it will be appreciated that various changes can be made therein without departing from the spirit and scope of the invention.

Other Applications

The parallel arc fault diagnostic system of the present invention can be usefully applied to other power distribution applications, in particular, residential and commercial wiring systems. There exists a need, for example, for re-inspection of older homes to ensure that the aged wiring is safe, e.g., that no incipient parallel faults are present that may develop into dangerous arcing faults. To accomplish this, the MED tool can be attached to the load center and the tests performed in the following manner. First, all the circuit breakers are turned to the off position, including the main service breaker and all loads in the home are either switched off or unplugged. The output 21 (FIG. 3) is clipped onto one of the two phases between the main service breaker and the branch breakers and the MED ground reference 11 (FIG. 2) is clipped onto ground. Then, as each branch circuit breaker is turned on, the MED tool will be connected to the hot side of that branch, allowing the normal sequence of tests described above to be performed on that branch circuit. In this manner, the circuit breakers themselves serve as a manually-operated sequencer. After all the breakers on one phase have been tested, the MED output is moved to the other phase and the same repeated with the breakers on that phase. Romex style wiring, as is typically used in homes and commercial installations, has a stable impedance on the order of 100 ohms and serves well as a transmission line to conduct the fast edge produced by a breakdown. Clean waveforms, similar to those shown in FIGS. 10 and 11, are readily obtained and the distance to the arc can be derived from an automatic measurement of the pulse width, as discussed previously.

In this residential example, a load may be inadvertently left connected to a particular branch circuit when the test is run. In this case, the MED tool detects that the voltage is not able to rise and indicates to the user that the load should first be unplugged before continuing with the test. As described before, because the interwire capacitance is charged with a low current source, no harm will be done to any such loads.

Both the EML tool and the USL tool can also be used, if needed, to locate the arc in these applications. It will be appreciated that minor changes in the design of the MED tool described for use on aircraft, such as removing the sequencer, can be made to better adapt the system for use in residential and commercial applications.

The embodiments of the invention in which an exclusive property or privilege is claimed are defined as follows:

1. A system for detecting and locating parallel arcing faults in a set of wires, the voltage at which a parallel arcing fault occurs being below a predetermined test voltage level, each parallel arcing fault producing two or more electromagnetic waveforms and ultrasonic emissions, each electromagnetic waveform having a leading edge, the system comprising:

a first device coupled to the set of wires for applying a current to a wire under test while grounding the remaining wires of the set of wires so as to charge a capacitance defined between the wire under test and the remaining wires up to the predetermined testing voltage, the first device being adapted to locate the distance to the parallel arcing fault using one or more leading edges of one or more electromagnetic waveforms being conducted on the wire under test;

a second device for locating and calculating the distance to the parallel arcing fault, the second device being comprised of a controller and two or more receivers, each receiver being electrically coupled to the controller for receiving one or more leading edges of one or more electromagnetic waveforms being radiated by the parallel arcing fault; and a third device for locating and calculating the distance to the parallel arcing fault, the third device being adapted to sense one or more leading edges of one or more electromagnetic waveforms as well as the ultrasonic emissions emitted from the parallel arcing fault.

2. The system of claim 1, wherein the first device is a hand-held device being powered by a battery.

3. The system of claim 1, wherein the first device includes a processor running a first piece of software for measuring the resistance of the insulation of the wire under test as well as the capacitance while the current is being applied to the wire under test.

4. The system of claim 3, wherein the first device includes a display displaying the resistance of the insulation of the re as well as the capacitance to the user.

5. The system of claim 3, wherein the processor has a second piece of software for recording the voltage at which the parallel arcing fault occurs, the processor being adapted to switch to run the second piece of software from the first piece of software when the parallel arcing fault occurs.

6. The system of claim 5, wherein the processor has a third piece of software for locating the parallel arcing fault, the processor being adapted to switch to run the third piece of software from the second piece of software when the voltage at which the parallel arcing fault occurs has been recorded.

7. The system of claim 6, wherein the first device includes high-speed circuitry to receive and process one or more leading edges or one or more electromagnetic waveforms being conducted along the wire under test so as to determine the location of the parallel arcing fault.

8. The system of claim 1, wherein the second device is a hand-held device being powered by a battery.

9. The system of claim 1, wherein the two or more receivers of the second device are electrically coupled to the controller via two or more coaxial cables.

10. The system of claim 1, wherein the third device is a hand-held device being powered by a battery.

* * * * *